(12) United States Patent
Marsh

(10) Patent No.: US 6,903,005 B1
(45) Date of Patent: Jun. 7, 2005

(54) METHOD FOR THE FORMATION OF $RUSi_xO_y$-CONTAINING BARRIER LAYERS FOR HIGH-K DIELECTRICS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 404 days.

(21) Appl. No.: 09/651,620

(22) Filed: Aug. 30, 2000

(51) Int. Cl.$^7$ .................... H01L 21/425; H01L 21/31
(52) U.S. Cl. .................. 438/627; 438/522; 438/530; 438/643; 438/653; 438/765
(58) Field of Search ................ 438/3, 239, 253, 438/396, 522, 530, 622, 627, 631, 643, 653, 680, 762, 765; 257/295, 296, 310, 751, 767

(56) References Cited

U.S. PATENT DOCUMENTS

| | | |
|---|---|---|
| 4,058,430 A | 11/1977 | Suntola et al. |
| 4,157,943 A | 6/1979 | Scarpellino, Jr. et al. ... 205/176 |
| 4,250,210 A | 2/1981 | Crosby et al. |
| 4,413,022 A | 11/1983 | Suntola et al. |
| 4,982,309 A | 1/1991 | Shepherd |
| 5,080,862 A | 1/1992 | Luthra |
| 5,122,923 A | 6/1992 | Matsubara et al. ......... 361/321 |
| 5,126,016 A | 6/1992 | Glenning et al. |
| 5,130,172 A | 7/1992 | Hicks et al. |
| 5,241,137 A | 8/1993 | Kiribayashi |
| 5,270,241 A | 12/1993 | Dennison et al. |
| 5,286,675 A | 2/1994 | Chen et al. |
| 5,314,727 A | 5/1994 | McCormick et al. |
| 5,335,138 A | 8/1994 | Sandhu et al. .............. 361/303 |
| 5,352,488 A | 10/1994 | Spencer et al. |
| 5,372,849 A | 12/1994 | McCormick et al. |
| 5,525,181 A | 6/1996 | Bruckner et al. |
| 5,529,953 A | 6/1996 | Shoda |
| 5,612,574 A | 3/1997 | Summerfelt et al. |
| 5,614,795 A | 3/1997 | Kim |
| 5,618,761 A | 4/1997 | Eguchi et al. |
| 5,637,533 A | 6/1997 | Choi |
| 5,662,815 A | 9/1997 | Kim |
| 5,705,442 A | 1/1998 | Yen et al. |
| 5,719,425 A | 2/1998 | Akram et al. ............... 257/344 |

(Continued)

FOREIGN PATENT DOCUMENTS

JP  9031042  2/1990

OTHER PUBLICATIONS

Cowles et al., Chemical Communications, p. 392, 1969.
Green et al., "Chemical Vapor Deposition of Ruthenium and Ruthenium Dioxide Films", J. Electrochem. Soc., vol. 132, No. 11, pp. 2677–2685, Nov. 1985.

(Continued)

*Primary Examiner*—Hung Vu
(74) *Attorney, Agent, or Firm*—TraskBritt, PC

(57) ABSTRACT

A method for use in the fabrication of integrated circuits is provided, which includes providing a substrate assembly having a surface. A diffusion barrier layer is formed over at least a portion of the surface. The diffusion barrier layer is formed of $RuSi_xO_y$, where x and y are in the range of about 0.01 to about 10. The barrier layer may be formed by depositing $RuSi_xO_y$ by chemical vapor deposition, atomic layer deposition, or physical vapor deposition or the barrier layer may be formed by forming a layer of ruthenium or ruthenium oxide over a silicon-containing region and performing an anneal to form $RuSi_xO_y$ from the layer of ruthenium and silicon from the adjacent silicon-containing region. Capacitor electrodes, interconnects or other structures may be formed with such a diffusion barrier layer. Semiconductor structures and devices can be formed to include diffusion barrier layers formed of $RuSi_xO_y$.

19 Claims, 5 Drawing Sheets

U.S. PATENT DOCUMENTS

| | | | |
|---|---|---|---|
| 5,729,054 | A | 3/1998 | Summerfelt et al. |
| 5,742,322 | A | 4/1998 | Cranton et al. |
| 5,843,830 | A | 12/1998 | Graettinger et al. ........ 438/396 |
| 5,866,460 | A | 2/1999 | Akram et al. ............... 438/306 |
| 5,874,174 | A | 2/1999 | Okuda et al. |
| 5,885,750 | A | 3/1999 | Hsiao et al. |
| 5,962,716 | A | 10/1999 | Uhlenbrock et al. |
| 5,994,034 | A | 11/1999 | Maehata |
| 6,063,705 | A | 5/2000 | Vaartstra |
| 6,133,159 | A | 10/2000 | Vaartstra et al. |
| 6,194,753 | B1 | 2/2001 | Seon et al. |
| 6,197,628 | B1 | 3/2001 | Vaartstra et al. |
| 6,320,213 | B1 * | 11/2001 | Kirlin et al. ................ 257/295 |
| 6,407,422 | B1 | 6/2002 | Asano et al. |
| 6,429,127 | B1 | 8/2002 | Derderian et al. |
| 6,461,909 | B1 * | 10/2002 | Marsh et al. ............... 438/238 |

OTHER PUBLICATIONS

Simpson et al., "Atomic Layer Epitaxy," Chem Br., vol. 23, No. 1, pp. 37–38, 40, Jan. 1987.

Hirva et al., "Theoretical Studies on the Growth Mechanisms of Silicon Thin Films by Atomic Layer Epitaxy," Surface Science, 220, pp. 137–151, 1989.

Gregory et al., "Conditions for the Deposition of CdTe by Electrochemical Atomic Layer Epitaxy," J. Electrochem. Soc., vol. 138, No. 5, pp. 1279–1284, May 1991.

Koleske et al., "Growth of Si on (100) via H/Cl Exchange and the Effect of Interfacial Boron," J. Appl. Phys., vol. 72, No. 9, pp. 4073–4082, Nov. 1, 1992.

Norton et al., "Organometallic Chemical Vapour Deposition of Platinum and Gold: Heterogeneous Deposition and Surface Chemistry," Surface Science, 307–309, pp. 172–176, 1994.

Borup et al., "Electrochemical and Vacuum Behavior of Carbon Monoxide and Lead Coadsorbed on Platinum (111)," J. Electroanalytical Chem, vol. 374, pp. 235–244, 1994.

Aquino et al., "Evidence for a Surface Methylene Species in the Decomposition of Trimethylgallium on GaAs(100)–(4× 1): A High Resolution Electron Energy Loss Spectroscopy Study," Surface Science, vol. 327, pp. 74–80, 1995.

Ylilammi, "Monolayer Thickness in Atomic Layer Deposition," Thin Solid Films, vol. 279, pp. 124–130, 1996.

George et al., "Surface Chemistry for Atomic Layer Growth," J. Phys. Chem., vol. 100, pp. 13121–13131, 1996.

Liao et al., "Characterization of RuO2 Thin Films Deposited on Si by Metal–Organic Chemical Vapor Deposition," *Thin Solid Films,* vol. 287, pp. 74–79, 1996.

Silmon et al., "Thickness Profiles of Thin Films Caused by Secondary Reactions in Flow–Type Atomic Layer Deposition Reactors," J. Phys. D: Appl. Phys., vol. 30, pp. 1725–1728, 1997.

Min et al., "Atomic Layer Deposition of TiN Films by Alternate Supply of Tetrakis (ethylmethytamino)–Titanium and Ammonia," *Jon. J. Appl. Phys.,* vol. 37, pp. 4999–5004, 1998.

* cited by examiner

METHOD FOR THE FORMATION OF RUSI$_x$O$_y$-CONTAINING BARRIER LAYERS FOR HIGH-K DIELECTRICS

BACKGROUND OF THE INVENTION

1. Field of the Invention

The present invention relates to semiconductor devices and the fabrication thereof. More particularly, the present invention pertains to diffusion barrier layers.

2. State of the Art

Integrated circuits typically include various conductive layers. For example, in the fabrication of semiconductor devices such as dynamic random access memories (DRAMs) and static random access memories (SRAMs), conductive materials are typically used in the formation of storage cell capacitors and interconnection structures (e.g., conductive layers in contact holes, vias, etc.). In many applications, such materials must provide effective diffusion barrier characteristics, which are required for conductive materials used in the formation of semiconductor structures, such as storage cell capacitors of memory devices (e.g., DRAMs).

As memory devices become more dense in terms of memory capacity per unit area, it is necessary to decrease the size of circuit components forming such devices. In order to retain storage capacity of storage cell capacitors of the memory devices while decreasing the memory device size, the dielectric constant of the dielectric layer of the storage cell capacitor is increased. To accomplish these goals, high dielectric constant materials interposed between two electrodes are used in such applications. When one or more layers of various conductive materials are used as the electrode material, the conductive materials must have certain diffusion barrier properties, such as silicon diffusion barrier properties (e.g., when the bottom electrode of a cell capacitor is used as an electrode). Such properties are particularly critical when high dielectric constant materials are used (e.g., in the dielectric layer of the storage cell capacitor) given that the processes used for forming such high dielectric constant materials usually occur at high temperatures (generally greater than about 500° C.) in an oxygen-containing atmosphere.

Various metals and metallic compounds, for example, metals such as platinum and conductive metal oxides such as ruthenium oxide, have been proposed for use as electrodes or as electrode stack layers with high dielectric constant materials. However, such electrical connections must be constructed so as to not diminish the beneficial properties of the high dielectric constant materials. For example, in order for platinum or ruthenium oxide to function well as a bottom electrode or as one of the layers of an electrode stack, an effective barrier to the diffusion of silicon from the substrate or other silicon-containing region to the top of the electrode must be provided. This is required to prevent silicon at the surface of the electrode stack from being oxidized during the oxygen anneal of the high dielectric constant materials, e.g., $Ta_2O_5$ or $BaSrTiO_3$, which oxidation results in a decreased series capacitance and, in turn, degradation of the storage capacity of the cell capacitor. Similarly, $O_2$ diffusing through the platinum or $RuO_2$ to the underlying Si yields $SiO_2$ at the base of the electrode, thus decreasing series capacitance. Platinum and ruthenium oxide, when used alone as an electrode, are generally too permeable to oxygen and silicon to be used as a bottom electrode of a storage cell capacitor formed on a silicon substrate region. Due to the permeability of such materials to oxygen and silicon, platinum is typically used as a layer in an electrode stack, acting as the electrode using a distinct diffusion barrier for integration of capacitors directly formed on silicon.

Examples of the foregoing structures and methods are known in the art. For example, as described in the article "Novel High Temperature Multilayer Electrode-Barrier Structure for High Density Ferroelectric Memories" by H. D. Bhatt, et al., *Appl. Phys. Letter*, 71(5), 4 Aug. 1997, the electrode barrier structure includes layers of platinum-:rhodium alloy, in addition to platinum:rhodium oxide layers, to form electrodes with diffusion barrier properties. Such alloy layers are formed using physical vapor deposition (PVD) processing (e.g., reactive RF sputtering processes). Further, for example, the article entitled "(Ba, Sr)TiO$_3$ Films Prepared by Liquid Source Chemical Vapor Deposition on Ru Electrodes" by Kawahara et al., *Jpn. J. Appl. Phys.*, Vol. 35 (1996) Pt. 1, No. 9B, pp. 4880–4885, describes the use of ruthenium and ruthenium oxide for forming electrodes in conjunction with high dielectric constant materials.

In view of the aforementioned shortcomings of the methods and structures being currently practiced, it would be advantageous to provide a barrier layer that maintains the performance of high dielectric capacitors, prevents oxidation of underlying Si contacts, and prevents silicon diffusion into an electrode or dielectric. It would be of further advantage to form a barrier layer that reduces or eliminates the diffusion or migration of ruthenium into an elemental Si or a silicide layer, or vice versa, which typically occurs as a result of the high solubility of silicon in ruthenium.

SUMMARY OF THE INVENTION

The present invention provides RuSi$_x$O$_y$-containing diffusion barrier layers, along with structures incorporating such diffusion barrier layers and methods of fabricating the same.

A method of fabricating semiconductor devices and assemblies (e.g., integrated circuits) according to the present invention includes providing a substrate assembly having a surface. A diffusion barrier layer is formed over at least a portion of the surface. The diffusion barrier layer includes RuSi$_x$O$_y$, where x and y are in the range of about 0.01 to about 10. The diffusion layer may, additionally, include Ru and/or RuSi$_x$. In one particular embodiment of the method, the diffusion barrier layer is formed of RuSi$_x$O$_y$, where x is in the range of about 0.1 to about 3, and more preferably is about 0.4, and where y is in the range of about 0.01 to about 0.1, and more preferably 0.1.

In another embodiment of the method, the barrier layer is formed by depositing a mixed film of Ru—RuSi$_x$—RuSi$_x$O$_y$ by chemical vapor deposition (CVD). In yet another embodiment of the method, the barrier layer is formed by CVD deposition of Ru—RuSi$_x$O$_y$ in an oxidizing atmosphere. All of the foregoing barrier layers and mixed films may also be formed by atomic layer deposition. This process can result in the formation of multiple RuSi$_x$O$_y$-containing diffusion barrier monolayers and, more preferably, formation of from three to five monolayers of RuSi$_x$O$_y$-containing diffusion barrier layers.

In an alternative embodiment, the barrier layer is formed by physical vapor deposition (PVD) of the diffusion barrier layers of the present invention. In one particular embodiment of the PVD deposition method, mixed films of Ru—RuSi$_x$—RuSi$_x$O$_y$ are deposited to form a diffusion barrier layer. Alternatively, mixed films of Ru—RuSi$_x$O$_y$ may be deposited to form a diffusion barrier layer.

A method for use in the formation of a capacitor according to the present invention includes forming a first electrode on a portion of a substrate assembly. A high dielectric material is formed over at least a portion of the first electrode and a second electrode is formed over the high dielectric material. At least one of the first and second electrodes includes a barrier layer formed of $RuSi_xO_y$, where x and y are in the range of about 0.01 to about 10.

According to yet another method of the present invention, a capacitor is formed by providing a silicon-containing region of a substrate assembly. A first electrode is then formed on at least a portion of the silicon-containing region of the substrate assembly. The first electrode includes a barrier layer having $RuSi_xO_y$, where x and y are in the range of about 0.01 to about 10. A high dielectric material is then formed over at least a portion of the first electrode and a second electrode is provided over the high dielectric material.

In an alternative embodiment of the method, one or more conductive layers are formed relative to the $RuSi_xO_y$-containing barrier layer. The one or more conductive layers are formed of at least one of a metal or a conductive metal oxide, e.g., formed from materials selected from the group consisting of $RuO_2$, $RhO_2$, $MoO_2$, $IrO_2$, Ru, Rh, Pd, Pt, and Ir.

A semiconductor device structure according to the present invention includes a substrate assembly including a surface and a diffusion barrier layer over at least a portion of the surface. The diffusion barrier layer is formed of $RuSi_xO_y$, where x and y are in the range of about 0.01 to about 10.

In one embodiment of the structure, at least a portion of the surface is a silicon-containing surface and the structure includes one or more additional conductive layers over the diffusion barrier layer formed of at least one of a metal and a conductive metal oxide, e.g., formed from materials selected from the group consisting of $RuO_2$, $RhO_2$, $MoO_2$, $IrO_2$, Ru, Rh, Pd, Pt, and Ir.

Semiconductor assemblies and structures according to the present invention are also described. One embodiment of such a structure includes a capacitor structure having a first electrode, a high dielectric material on at least a portion of the first electrode, and a second electrode on the dielectric material. At least one of the first and second electrodes includes a diffusion barrier layer formed of $RuSi_xO_y$, where x and y are in the range of about 0.01 to about 10.

Another such structure is an integrated circuit including a substrate assembly including at least one active device and a silicon-containing region. An interconnect is formed relative to the at least one active device and the silicon-containing region. The interconnect includes a diffusion barrier layer on at least a portion of the silicon-containing region. The diffusion barrier layer is formed of $RuSi_xO_y$, where x and y are in the range of about 0.01 to about 10.

BRIEF DESCRIPTION OF THE DRAWINGS

The present invention will be better understood from reading the following detailed description taken in conjunction with the accompanying drawings, wherein.

DETAILED DESCRIPTION OF THE INVENTION

Figure 1:
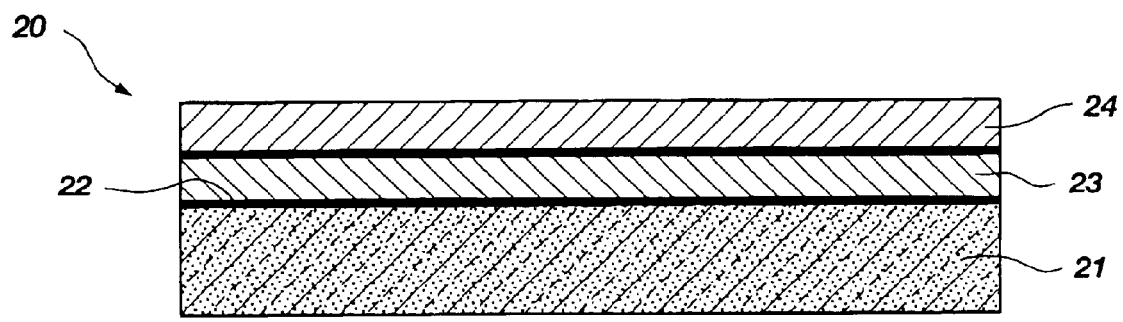
FIG. 1 shows a device structure including a $RuSi_xO_y$-containing diffusion barrier layer according to the present invention.

Referring to FIG. 1, a structure 20 according to the present invention includes a substrate assembly 21 and a $RuSi_xO_y$-containing diffusion barrier layer 23 disposed on a surface 22 of the substrate assembly 21, e.g., a silicon-containing substrate. The structure 20 further includes a conductive layer 24. As used herein, "substrate assembly" refers to either a semiconductor substrate such as the base semiconductor layer (e.g., base silicon layer of a wafer), a silicon layer deposited on another material (e.g., silicon on sapphire), or a semiconductor substrate having one or more layers, structures, and/or regions formed thereon or therein. It is understood that reference to a substrate assembly herein also includes any known process steps that may have been previously used to form or define regions, junctions, various structures or features, and openings (e.g., vias, contact openings, high aspect ratio openings, etc.).

The structure 20 is representative of a $RuSi_xO_y$-containing diffusion barrier layer that may be used for any application requiring an effective barrier layer, for example, to prevent oxidation of an underlying Si contact, or to prevent diffusion into an electrode or dielectric from a silicon-containing surface. The $RuSi_xO_y$-containing diffusion barrier layer 23 may be used in the fabrication of semiconductor devices or assemblies where it is necessary or desirable to prevent diffusion of one material to an adjacent material. As described more fully hereinafter, the $RuSi_xO_y$-containing diffusion barrier layer 23 may include Ru and/or $RuSi_x$, in addition to $RuSi_xO_y$.

The substrate assembly 21 may, for example, be representative of a contact structure having an opening extending to a silicon-containing surface. In such a structure, diffusion barriers are commonly used within the contact opening to prevent undesirable reactions, such as reactions between the conductive contact material and the silicon-containing surface. Alternatively, the $RuSi_xO_y$-containing diffusion barrier layer 23 may be used to form storage cell capacitors in semiconductor devices (e.g., memory devices). By way of example, the $RuSi_xO_y$-containing diffusion barrier layer 23 may be interposed between other layers of materials (e.g., ruthenium oxide, platinum, etc.) forming an electrode of a capacitor.

It is understood that persons having ordinary skill in the art will recognize that the diffusion barriers of the present invention can be used in any semiconductor processes, structures, assemblies and devices (e.g., CMOS devices and memory devices) which utilize barrier layers.

The amount of elemental Si and $SiO_2$ incorporated into the $RuSi_xO_y$-containing diffusion barrier layer 23 is sufficient to accomplish barrier characteristics for semiconductor devices, particularly for diffusion of silicon and oxygen, for example, into the electrode and/or dielectric of a capacitor. Preferably, the $RuSi_xO_y$-containing diffusion barrier layer 23 includes an atomic composition such that x and y are in the range of about 0.01 to about 10. More preferably, x and y are in the range of about 1 to about 3, and yet more preferably, x is about 0.4 and y is about 0.1. Likewise, in embodiments of the invention where the $RuSi_xO_y$-containing diffusion barrier layer 23 of the present invention contains $RuSi_x$, the $RuSi_x$ includes an atomic composition such that x is in the range of about 0.01 to about 10, and more preferably in the range of about 0.1 to about 0.5, and yet more preferably, x is about 0.4.

The thickness of the $RuSi_xO_y$-containing diffusion barrier layer 23 is dependent upon the application for which it is used. Preferably, the thickness is in the range of about 10 Å to 5,000 Å. More preferably, the thickness of the $RuSi_xO_y$-containing diffusion barrier layer 23 is in the range of about 50 Å to about 500 Å. For example, this preferred thickness range of about 50 Å to about 500 Å is applicable to a $RuSi_xO_y$-containing diffusion barrier layer used for forming a bottom electrode stack of a capacitor structure.

The conductive layer 24 shown in FIG. 1 is representative of one or more layers. For example, the conductive layer 24 may include one or more layers formed of a metal or metal oxide, or combinations thereof. Such layers may include one of $RuO_2$, $MoO_2$, Rh, $RhO_2$, $IrO_2$, Ru, Pt, Pd and Ir, such as when the $RuSi_xO_y$-containing diffusion barrier layer is used in an electrode stack. Alternatively, the conductive layer 24 may be a contact material, such as aluminum, when the $RuSi_xO_y$-containing diffusion barrier layer is used in a contact or interconnect application. Such conductive layers may be formed by any method known to those skilled in the art.

The $RuSi_xO_y$-containing diffusion barrier layer 23 may be formed by various processes. For example, the formation of the $RuSi_xO_y$-containing diffusion barrier layer 23 may be sputter deposited from a deposition target of $RuSi_xO_y$, may be deposited by the sputtering from a deposition target of ruthenium onto a silicon-containing surface followed by an anneal, may be deposited by physical vapor deposition (PVD) of Ru—$RuSi_x$—$RuSi_xO_y$ mixed films, or may be deposited by CVD using a ruthenium precursor and a silicon precursor in an oxidizing atmosphere, or may be deposited by CVD of Ru—$RuSi_x$—$RuSi_xO_y$ films. Suitable CVD processes include, for example, atmospheric pressure chemical vapor deposition, low pressure chemical vapor deposition (LPCVD), plasma enhanced chemical vapor deposition (PECVD), or any other known chemical vapor deposition technique. Further, the $RuSi_xO_y$-containing diffusion barrier layer may be formed by depositing a layer of ruthenium using CVD onto a silicon-containing surface followed by an annealing process.

The aforementioned CVD processes may be carried out in a chemical vapor deposition reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing CVD may be used.

Oxidizing agents for use in the CVD process may be any gaseous reactant which is capable of reacting with the Ru precursor compounds at the decomposition temperatures of the latter to form Ru—$RuSi_x$—$RuSi_xO_y$ films. Suitable oxidizing agents for use with the present method include, but are not limited to, air, oxygen, and oxygen-containing compounds, such as nitrous oxide, tetrahydrofuran, and carbon dioxide, and are preferably selected from mildly oxidizing gaseous oxygen sources.

CVD may be defined as the formation of a nonvolatile solid film on a substrate by the reaction of vapor phase reactants, i.e., reactant gases, that contain desired components. The reactant gases are introduced into the reaction chamber. The gases decompose and react at a heated wafer surface to form the desired layer. Chemical vapor deposition is just one process of providing thin layers on semiconductor wafers, such as films of elemental metals or compounds (e.g., platinum, ruthenium oxide, iridium, molybdenum oxide, etc). Chemical vapor deposition processes are favored in many respects because of the process capability to provide highly conformal layers even within deep contacts and other openings. Thus, as described further below with reference to FIGS. 5 and 6, CVD processing is preferably used to provide highly conformal layers within deep contacts and other openings such as for lower electrodes of storage cell capacitors. It will be readily apparent to one skilled in the art that although CVD is the preferred process, that the CVD process may be enhanced by various related techniques such as plasma assistance, photo assistance, laser assistance, as well as other techniques. In addition, atomic layer deposition could be used to form conformal layers. This is a variant of CVD in which a single atomic layer is formed on the surface. The layer thickness is self limiting to $\leq 1$ atomic layer. This layer is exposed to reaction gas after pump down or purge, is fully reacted, and the reaction gas pumped away. The process is repeated to yield the desired number of layers.

In addition, atomic layer deposition could be used to form the layer. This process is a special type of CVD in which, based on the process conditions and/or chemistry used, at most, a single layer comprising a single type of atom is deposited at one time. Accordingly, the thickness of the layer is, at most, the thickness of the relevant atom; hence, the layer may be referred to as a "monolayer." Once one monolayer is deposited, the deposition gas is purged and a second monolayer comprising a different type of atom is deposited over the first monolayer. Additional monolayers may be provided in a similar manner, provided the gases from earlier deposition steps are purged from the chamber before each subsequent monolayer is deposited. Once at least two monolayers have been deposited, they may be reacted.

One preferred method of forming the $RuSi_xO_y$-containing diffusion barrier layer 23 is by depositing $RuSi_x$ by CVD. The CVD process is conducted with a ruthenium precursor being delivered to a reaction chamber along with a silicon precursor. Typical ruthenium precursors in use include liquid ruthenium metal-organic precursors. The ruthenium precursor is contained in a bubbler reservoir through which a carrier gas, such as helium or any other inert gas, i.e., a gas that is nonreactive with other gases of the process (e.g., nitrogen, argon, neon, and xenon), is bubbled through the reservoir containing the precursor to deliver the precursor to the reaction chamber. For example, a carrier gas having a volumetric flow rate in the range of about one sccm to about 500 sccm may be used in a bubbler having a pressure in the range of about 0.5 torr to about 50 torr and a temperature in the range of about 30° C. to about 70° C. to deliver a ruthenium precursor to the reaction chamber.

Any ruthenium-containing precursor may be used in accordance with the present invention. Preferably, the ruthenium precursors are liquid ruthenium complexes of the following formula (Formula I): $(diene)Ru(CO)_3$ wherein: "diene" refers to linear, branched, or cyclic dienes, bicyclic dienes, tricyclic dienes, fluorinated derivatives thereof, combinations thereof, and derivatives thereof additionally containing heteroatoms such as halide, Si, S, Se, P, As, or N.

These precursor complexes and others, as well as various CVD processes, are described in Assignees' copending patent application U.S. Ser. No. 09/141,236, entitled "Precursor Chemistries for Chemical Vapor Deposition of Ruthenium and Ruthenium Oxide," and in Assignees' copending patent application entitled "Methods for Preparing Ruthenium and Osmium Compounds" having U.S. Ser. No. 09/141,431, both of which are incorporated by reference herein. Additional precursors and methods of depositing ruthenium layers are generally discussed in U.S. Pat. No. 5,372,849 to McCormick et al., which is incorporated by reference herein. More preferably, the ruthenium precursors used according to the present invention include one of $C_6H_8Ru(CO)_3$, $(C_7H_{10})Ru(CO)_3$, bis(cyclopentadienyl) ruthenium (II), triruthenium dodecacarbonyl, and cyclopentadienyl dicarbonyl ruthenium (II) dimer.

The silicon precursor is also provided to the reaction chamber. For example, the silicon precursor may include a silicon hydride or silane such as dichlorosilane (DCS, $SiH_2Cl_2$), silane ($SiH_4$), disilane ($H_3SiSiH_3$), trichlorosilane (TCS, $SiHCl_3$), or any other silicon precursor as would be recognized by one skilled in the art. For example, the silicon precursor may be provided to the reaction chamber at a rate in the range of about 0.1 sccm to about 500 sccm. Preferably, the rate is about 10 sccm.

One skilled in the art will recognize that the manner in which the gases are introduced into the reaction chamber may include one of various techniques. For example, in addition to provision by bubbler techniques, the introduction may be accomplished with the use of compounds which are gases at room temperature or by heating a volatile compound and delivering the volatile compound to the reaction chamber using a carrier gas. Further, solid precursors and various methods of vaporizing such solid precursors may also be used for introduction of reactant compounds into the chamber. As such, the present invention is not limited to any particular technique. For example, reactant gases can be admitted at separate inlet ports. In addition to the other gases provided to the reaction chamber, an optional carrier or dilution gas (i.e., a gas that is nonreactive with the reactant gases) may also be introduced into the chamber such as to change the concentrations of the gases therein. For example, argon gas may be introduced into the chamber at a varied flow rate. Oxidizing gases can also be introduced into the reaction chamber when an oxidizing atmosphere is desired.

In accordance with one method of forming the $RuSi_xO_y$-containing diffusion barrier layer, the ruthenium precursor gas, the silicon precursor gas, optionally a dilution gas, and an oxidizing gas (if necessary) is provided to the reaction chamber. In this preferred CVD process, the reaction chamber pressure is preferably maintained at a deposition pressure of about 0.1 torr to about 10 torr. The deposition temperature at the wafer surface upon which the $RuSi_xO_y$-containing diffusion barrier layer 23 is deposited is preferably held at a temperature in a range of about 100° C. to about 700° C., more preferably in the range of about 200° C. to about 500° C.

Figure 2:
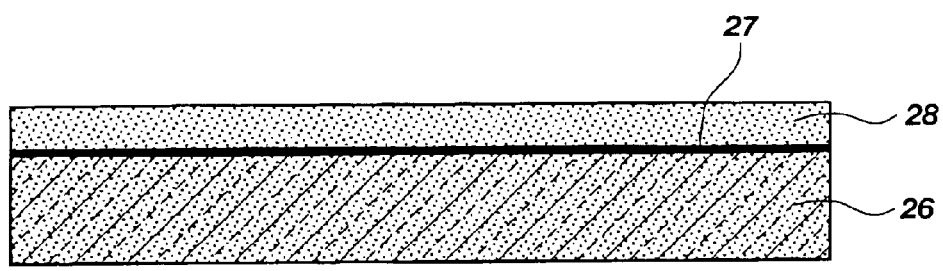
FIGS. 2–4 show one method of forming the $RuSi_xO_y$-containing diffusion barrier layer according to the present invention.
Figure 3:
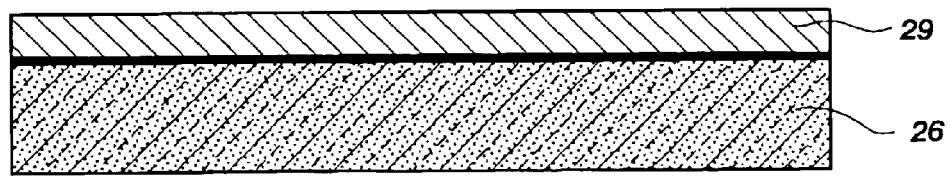
Figure 4:
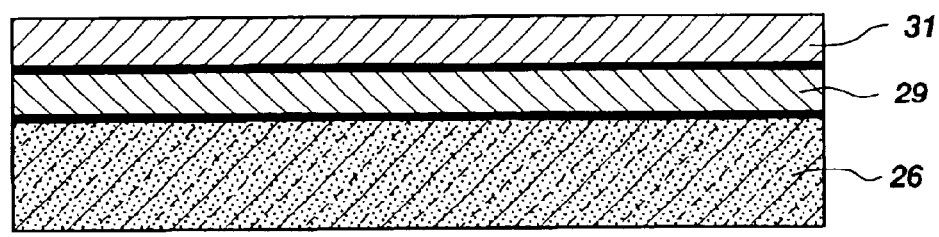

Another preferred method of forming a $RuSi_xO_y$-containing diffusion barrier layer 29 according to the present invention is shown in FIGS. 2–4. This method forms the $RuSi_xO_y$-containing diffusion barrier layer 29 by depositing a layer of ruthenium 28 as shown in FIG. 2 onto a silicon-containing region of substrate assembly 26 using a CVD technique. Generally, the method can be carried out by introducing a ruthenium precursor composition into a CVD chamber together with a carrier or dilution gas, as described in Applicant's Assignees' copending patent application entitled "Methods for Preparing Ruthenium Oxide Films," having Ser. No. 09/140,932, the contents of which are incorporated by reference herein. This ruthenium deposition step is followed by an annealing process to react the silicon-containing region having silicon-containing surface 27 with the ruthenium layer 28. The annealing process is carried out in an oxidizing atmosphere, such as oxygen gas, to further oxidize the deposited layer and to form the $RuSi_xO_y$-containing diffusion barrier layer 29 shown in FIG. 3. Various combinations of carrier gases and/or reaction (oxidizing) gases can be used in the methods of the present invention. The gases can be introduced into the CVD deposition chamber in a variety of manners, such as directly into a vaporization chamber of the CVD deposition chamber or in combination with the ruthenium precursor composition. Thereafter, a conductive layer 31 (e.g., the conductive layer 24 of FIG. 1) is formed on the $RuSi_xO_y$-containing diffusion barrier layer 29, as shown in FIG. 4.

The annealing process is preferably performed in situ in the reaction chamber in a nitrogen atmosphere, although any other nonreactive atmosphere may be used, e.g., argon. Preferably, the annealing temperature is within the range of about 400° C. to about 1000° C., more preferably about 500° C. The anneal is preferably performed for a time period of about 0.5 minutes to about 60 minutes. One of ordinary skill in the art will recognize that such temperatures and time periods may vary and that the anneal parameters should be sufficient to convert the ruthenium layer 28, following oxidation, into $RuSi_xO_y$-containing diffusion barrier layer 29, where x and y are in the ranges previously described herein. For example, various anneal techniques (e.g., furnace anneals, anneal, process RTP, and rapid thermal smearing) may be used and may be performed in one or more annealing steps. Likewise, it may not be necessary or desirable to convert the entire ruthenium layer to $RuSi_xO_y$ as long as sufficient barrier properties are attained with the amount of ruthenium converted.

The ruthenium layer 28 deposited for forming the $RuSi_xO_y$-containing diffusion barrier layer 29 is preferably of a thickness in the range of about 10 Å to about 1000 Å. More preferably, the thickness is in the range is about 50 Å to about of 500 Å and, even more preferably, the thickness is about 300 Å.

Figure 5:
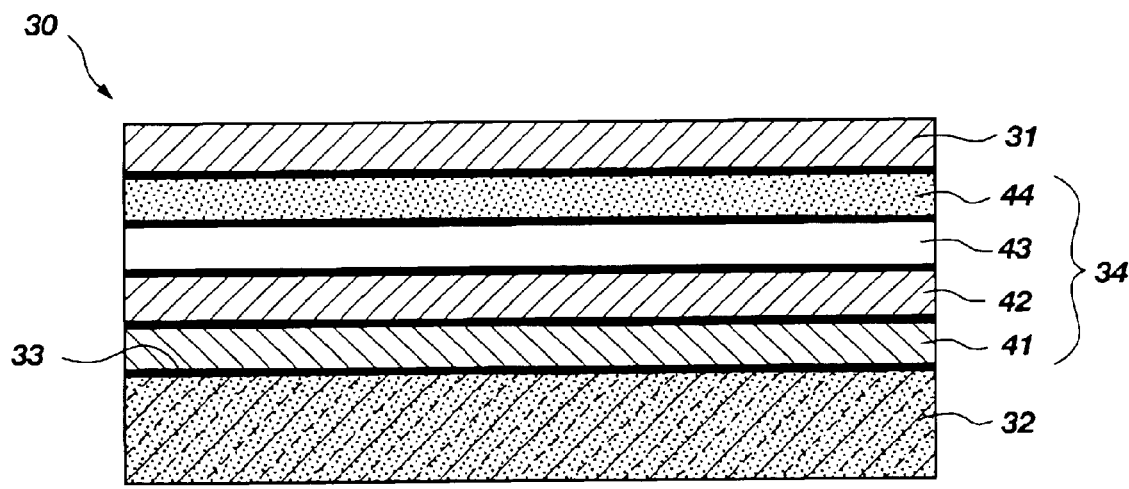
FIG. 5 shows a structure including a $RuSi_xO_y$-containing diffusion barrier layer according to the present invention as part of a multiple conductive layer stack.

Referring to FIG. 5, a structure 30 is shown which includes a substrate assembly 32, e.g., a silicon substrate region, and a stack 34. The stack 34 includes conductive layers 41–44. One or more of the conductive layers 41–44 may be $RuSi_xO_y$-containing diffusion barrier layers according to the present invention. The one or more conductive layers, in addition to including one or more $RuSi_xO_y$-containing diffusion barrier layers, may include conductive layers formed of various conductive materials. For example, the conductive layers may include, but are not limited to, layers formed of metals, metal oxides or combinations thereof. By way of example, the conductive layers may include metals such as rhodium, palladium, ruthenium, platinum, and iridium or metal oxides such as ruthenium oxide, rhodium oxide, molybdenum oxide and iridium oxide.

The stack 34 may be used for various applications, such as, interconnection applications and capacitor applications. For example, the stack 34 may be used as an electrode for a storage cell capacitor with substrate assembly 32 including a silicon-containing surface 33. As such, the barrier properties of the stack 34 prevent silicon diffusion from silicon-containing surface 33. In accordance with the present invention, the layer 41 may be formed as the $RuSi_xO_y$- containing diffusion barrier layer to prevent diffusion of silicon from silicon-containing surface 33 through stack 34 to adjacent layer or layers 39 or to the surface of the stack 34, and to prevent oxygen diffusion to the silicon-containing surface.

Figure 6:
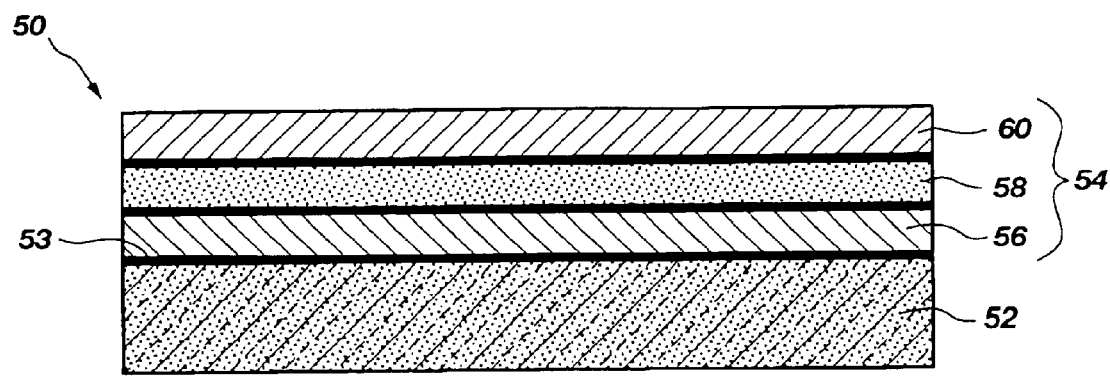
FIG. 6 is a structure showing a high dielectric capacitor including an electrode having a $RuSi_xO_y$-containing diffusion barrier layer according to the present invention.

FIG. 6 shows a structure 50 including substrate assembly 52, e.g., a silicon substrate, and capacitor structure 54 formed relative thereto. Capacitor structure 54 includes a first electrode 56, a second electrode 60, and a high dielectric constant layer 58 interposed therebetween. The dielectric layer may be any suitable material having a desirable dielectric constant, such as, for example, $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$, and/or $LiNbO_3$. With use of the high dielectric constant layer 58, diffusion barrier properties of the electrodes is particularly important.

In a bottom electrode of a capacitor structure, such as that shown in FIG. 6, the electrode layer or electrode stack must act as an effective barrier to the diffusion of silicon, particularly due to the high temperature processes used to form the high dielectric constant materials. Such diffusion barrier properties are particularly essential when the substrate assembly 52 includes a silicon-containing surface 53 (e.g., polysilicon, silicon substrate material, N-doped silicon, P-doped silicon) upon which the capacitor is formed, due to oxidation of the diffused silicon which may result in degraded capacitance, such as that seen in memory devices. Additionally, the electrode stack must act as an oxygen barrier to protect the silicon-containing surface under the stack from oxidizing. The formation of the $RuSi_xO_y$-containing diffusion barrier layer enhances the barrier properties of the stack. One of ordinary skill in the art will recognize that the first electrode 56 includes one or more $RuSi_xO_y$-containing diffusion barrier layers and one or more additional conductive layers, as described with reference to FIG. 5.

Figure 7:
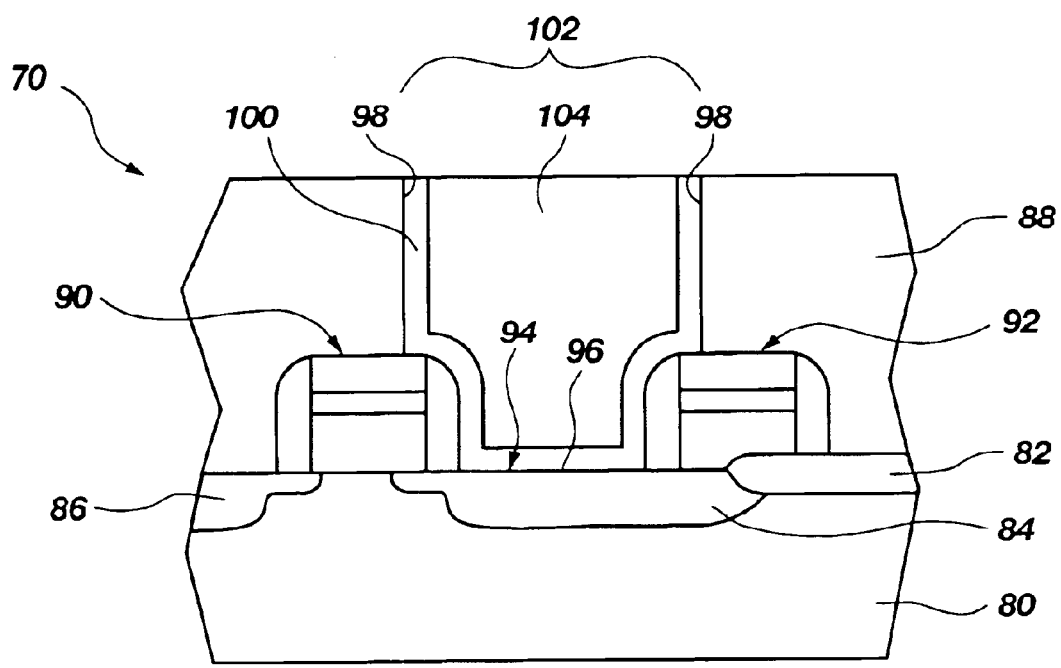
FIG. 7 illustrates the use of a $RuSi_xO_y$-containing diffusion barrier layer in a storage cell capacitor application.

The $RuSi_xO_y$-containing diffusion barrier layers of the present invention have numerous and varied applications in the area of semiconductor device and semiconductor structure fabrication. For example, the use of $RuSi_xO_y$-containing diffusion barrier layers of the present invention is described with reference to FIG. 7, wherein a contact liner requiring diffusion barrier characteristics is described. More specifically, device structure 70 is fabricated in accordance with conventional processing techniques through the formation of contact opening 102 prior to metallization of the contact area 94 of substrate 80. As such, prior to metallization, the device structure 70 includes field oxide region 82 and active areas (represented by regions of substrate 80 not covered by field oxide). Word line 92 and field effect transistor (FET) 90 are formed relative to the field oxide regions 82 in the active areas. Suitably doped source/drain regions 84, 86 are formed by conventional methods known to one of ordinary skill in the art. A conformal layer of oxide material 88 is formed thereover and contact opening 102 is defined therein to the contact area 94 of doped region 84 of silicon substrate 80. Thereafter, one or more metallization or conductive layers (e.g., titanium nitride or other diffusion barrier materials) are formed in the contact opening 102 for providing electrical connection to source region 84. Preferably, contact liner 100 is a $RuSi_xO_y$-containing diffusion barrier layer formed according to the present invention on bottom surface 96 and the one or more sidewalls 98 defining the contact opening 102. The $RuSi_xO_y$-containing diffusion barrier layer is generally deposited over the entire substrate assembly and then planarized to form the contact liner 100. Thereafter, a conductive material 104 (e.g., aluminum, W, Cu) is formed in the contact opening for providing connection to doped source region 84 of substrate 80.

Figure 8:
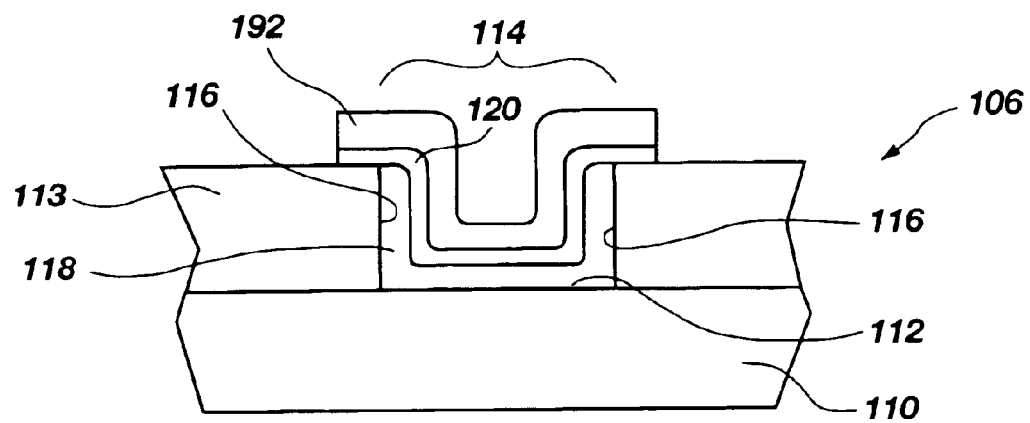
FIG. 8 illustrates the use of a $RuSi_xO_y$-containing diffusion barrier layer in a contact application.

Alternatively, the present invention may be used to fabricate a bottom electrode of a high dielectric capacitor of a storage cell that includes one or more $RuSi_xO_y$-containing diffusion barrier layers, as described in FIG. 8. Specifically, a device structure 106 is fabricated in accordance with conventional processing techniques through the formation of an opening 114 prior to depositing a bottom electrode structure 118 on the surface 112 (preferably a silicon-containing surface) and surface 116 defining the opening 114. A bottom electrode structure 118, which includes a $RuSi_xO_y$-containing diffusion barrier layer, and one or more other conductive layers is formed in opening 114 according to the present invention, as previously described herein. The substrate assembly 110 may include various elements, such as field oxide regions, active regions (i.e., regions of a silicon substrate not covered by field oxide) word lines, field effect transistors (FET), and source/drain regions created in the silicon substrate. An insulative layer of oxide material 113 is formed over the substrate assembly. The opening 114 in the insulative layer of oxide material 113 is a small, high aspect ratio opening. As described herein, small, high aspect ratio openings have feature sizes or critical dimensions below about 1 micron (e.g., such as a diameter or width of an opening being less than about 1 micron) and aspect ratios (ratio of depth to width) greater than about 4. Such aspect ratios are applicable to contact holes, vias, trenches, and any other configured openings. For example, a trench having an opening of 1 micron and depth of 3 microns has an aspect ratio of 3. The present invention is particularly useful in the formation of diffusion barrier layers in small, high aspect ratio features due to the use of CVD processes for forming conformal $RuSi_xO_y$-containing diffusion barrier layers over step structures.

As shown in FIG. 8, a bottom electrode structure 118, including an $RuSi_xO_y$-containing diffusion barrier layer, is formed on the surface 112 and the one or more surfaces 116 defining opening 114. In this particular embodiment of the invention, the electrode stack layers are formed over the entire structure, including the surface 112 and surface 116. The layers are then formed into bottom electrode structure 118. By way of example, the stack layers may be etched or planarized to remove desired regions for forming the bottom electrode structure 118. Thereafter, dielectric layer 120 is formed relative to the bottom electrode structure 118. The second electrode 192 is then formed relative to the dielectric material 120. Such an electrode may, for example, be composed of any suitable conductive material, such as tungsten nitride, titanium nitride, tantalum nitride, ruthenium, rhodium, iridium, ruthenium oxide, iridium oxide, any combination thereof, or any other conductive material typically used as an electrode or electrode layer of a storage cell capacitor. In accordance with the instant embodiment of the present invention, the bottom electrode is conformally formed of a stack of layers, including a $RuSi_xO_y$-containing diffusion barrier layer, having uniform thickness and deposited using CVD processes to provide suitable barrier properties.

It will be recognized by one skilled in the art that, in addition to the embodiments described herein, any capacitor formed relative to a surface (e.g., silicon-containing surface) whereupon diffusion barrier properties are required and/or conformally formed conductive layers are required may benefit from the present invention. For example, container capacitors typically include electrodes formed on surfaces requiring conformal formation of a bottom electrode. Such a container capacitor storage cell is described in U.S. Pat. No. 5,270,241 to Dennison, et al., entitled "Optimized Container Stack Capacitor DRAM Cell Utilizing Sacrificial Oxide Deposition and Chemical Mechanical Polishing," issued Dec. 14, 1993, and incorporated herein by this reference. The present invention may also be employed in the fabrication of other semiconductor processes and structures for various devices (e.g., CMOS devices, memory devices, logic devices, etc.). It should be understood that the present invention is not limited to the illustrative embodiments described herein and that the $RuSi_xO_y$-containing diffusion barrier layer of the present invention may be used for any application requiring diffusion barrier characteristics, particularly those for preventing diffusion of silicon and/or oxygen into adjacent layers.

FIGS. 9 through 12 show x-ray photo-electron spectrographic (XPS) depth profiles of sample wafers including layers containing $RuO_2$, Si, and TiN layers, and additionally having a $RuSi_xO_y$ diffusion barrier layer therein. The $RuSi_xO_y$ diffusion barrier layer was formed by a conventional CVD process. For each individual sample, a pre-anneal and post-anneal XPS analysis was conducted to determine the chemical state of the silicon and whether the TiN survived the anneal process. The depth profile was determined for the sample wafer after the structure had undergone rapid thermal nitridation (RTN) at a temperature of about 700° C. for a time period of about 60 seconds. Under such conditions the $RuO_2$ film disporportionates to $Ru+RuO_4$ and will oxidize the TiN if no barrier is present. As described hereinafter, the analytical data shows that no oxidation or silicidation of the TiN layer was observed and that minimal, if any, silicon diffusion through the $RuSi_xO_y$ diffusion barrier layer and, therefore, no oxidation of the silicon layer in the tested samples was observed.

The reaction chamber used for fabricating the sample wafer was a CVD chamber manufactured by MDC Vacuum Products Corp. (Hayward, Calif.) and the bubblers used are glass research bubblers from Technical Glass Service (Boise, Id.). The conditions used for forming the $RuSi_xO_y$-containing diffusion barrier layer include:

Ruthenium Precursor: $C_6H_8Ru(CO)_3$.

Ruthenium Carrier Gas for use through Bubbler: 5 sccm of helium.

Ruthenium Bubbler Conditions: pressure of 3 torr, temperature of 25° C.

Reaction Chamber Conditions: pressure of 0.5 torr, deposition temperature of 240° C. at wafer surface, 0.2 sccm $Si_2H_6$.

Deposition Time: 1 minute.

The conditions used for the forming the ruthenium oxide layer include:

Ruthenium Precursor: $C_6H_8Ru(CO)_3$.

Ruthenium Carrier Gas for use through Bubbler: 40 sccm of helium, 40 sccm $O_2$ reaction gas.

Ruthenium Bubbler Conditions: pressure of 3 torr, temperature of 25° C.

Reaction Chamber Conditions: pressure of 3 torr, deposition temperature of 230° C. at wafer surface.

Deposition Time: 20 minutes.

The depth profile was attained by using an XPS device available under the trade designation PhI (Φ) 5600 from Physical Electronics (Eden Prairie, Minn.). The operating conditions for obtaining the profile include x-ray source of 350 W, monochromatic Al $K_a$(hV=1486.6 eV); 45 degree exaction; 800 μm extraction aperture. Sputtering was performed with a 3 keV Argon ion beam restored over a 3 mm area. The sputter time for the depth profile was 20 minutes.

Figure 9:
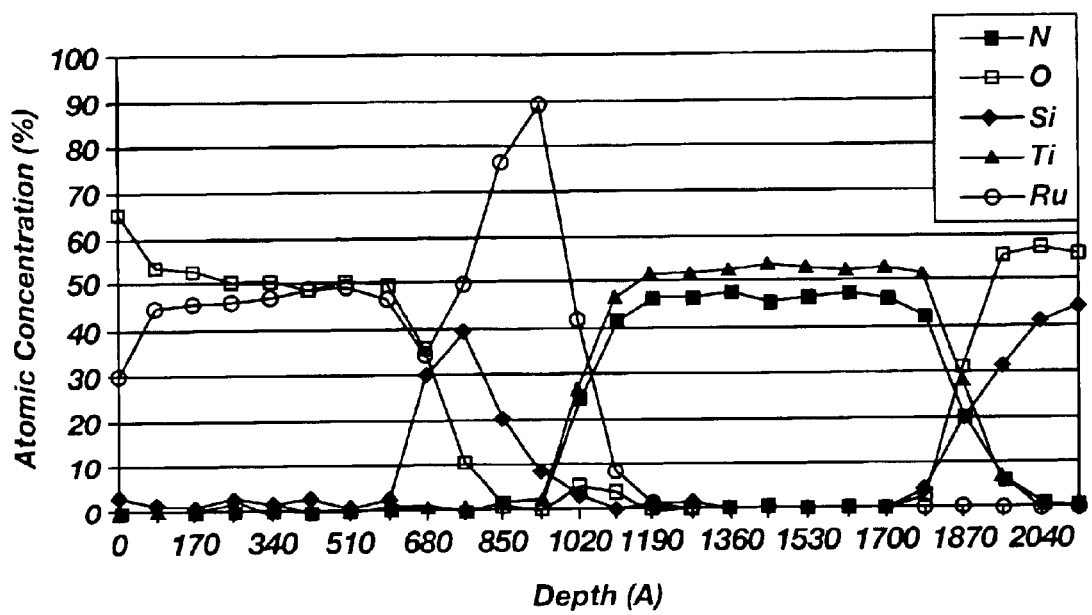
FIGS. 9–12 illustrate x-ray photo spectrographic (XPS) depth profiles of various semiconductor multilayered assemblies including $RuSi_xO_y$-containing diffusion barriers.

FIG. 9 shows a depth profile of a sample wafer including a $RuO_2$ layer having a thickness of about 700 Å formed over a $Ru/RuSi_xO_y$ layer having a thickness of about 300 Å formed on a $SiO_2$ substrate. FIG. 9 shows the films as deposited before any oxidizing anneals and, thus, represents a control.

Figure 10:
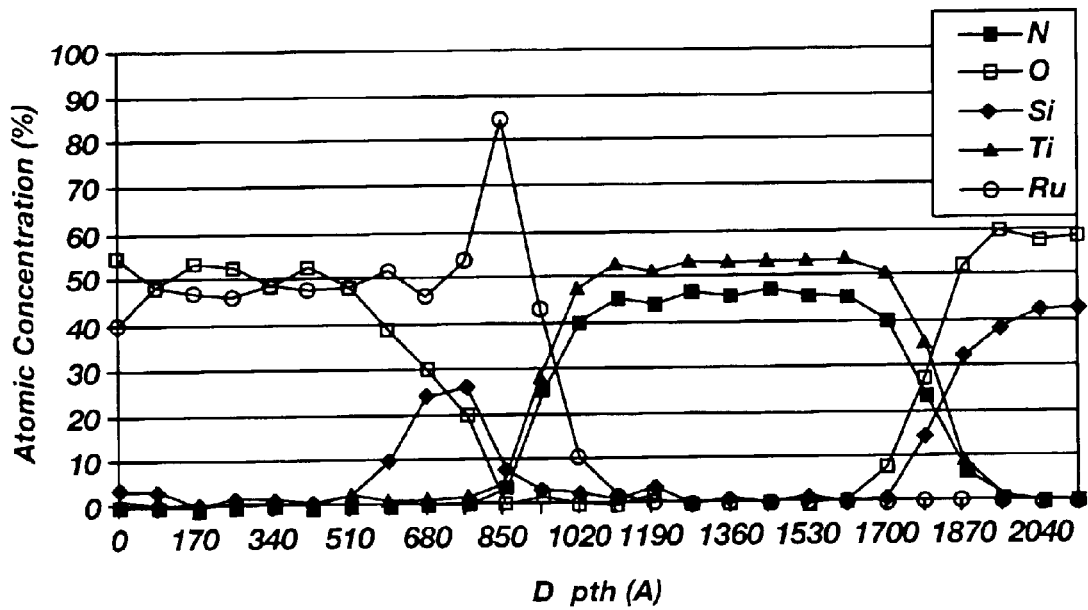

FIG. 10 shows the same film as described in FIG. 9 after undergoing RTN. After the structure has undergone RTN at a temperature of about 700° C. for a time period of 60 seconds, that is, when the $RuO_2$ layer is subjected to RTN, it produces $RuO_4$. In the absence of the $Ru/RuSi_xO_y$ layer, the underlying TiN layer would be completely oxidized. However, due to the presence of the $Ru/RuSi_xO_y$ layer, an effective barrier is created, thus preventing oxidation of the underlying layer (i.e., TiN layer).

Figure 11:
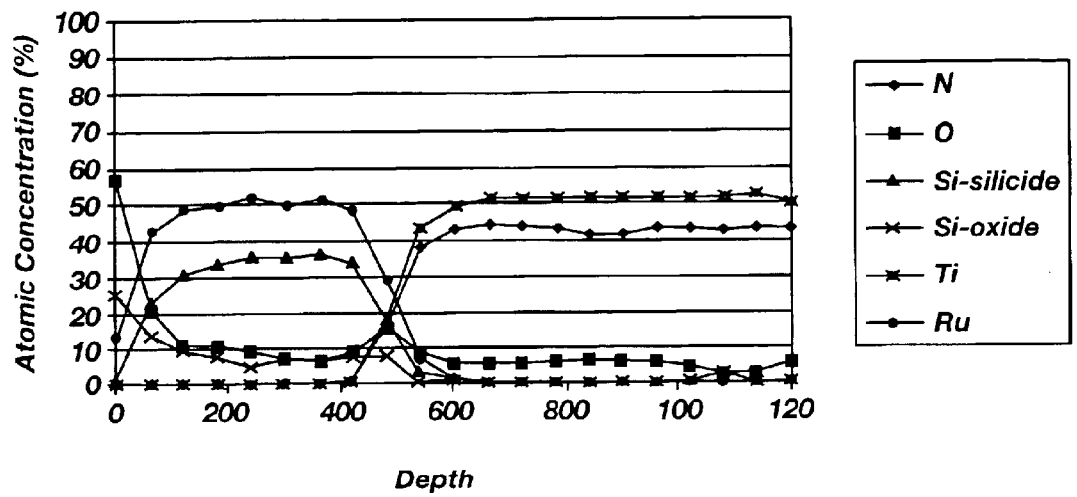

FIG. 11 represents a depth profile of a sample wafer as described in reference to FIGS. 9 and 10, except that the RuSi layer was deposited using 5 SCCM of $N_2O$ as an oxidizer (40 SCCM He carrier 0.2 SCCM $Si_2H_6$ at 260° C. and 3 torr). As shown in FIG. 11, the XPS atomic concentration depth profile of this pre-RTN sample indicates the presence of a $SiO_2$-containing $RuSi_x$ layer having a thickness of about 500 Å.

Figure 12:
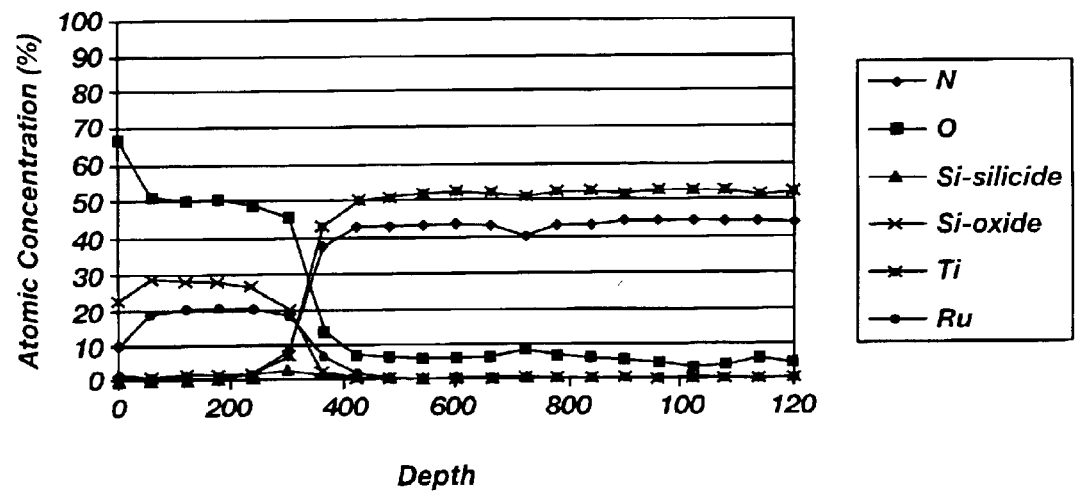

FIG. 12 represents a depth profile of a sample wafer as described in reference to FIG. 11, except that $RuSi_x$ layer was deposited in the absence of an oxidizer. As shown in FIG. 12, the XPS atomic concentration depth profile of this pre-RTN sample indicates the presence of a $SiO_2$-containing $RuSi_x$ layer having a thickness of about 350 Å on a TiN layer. Notably, no $RuSi_x$ was detected in the Ru-containing film, only $RuSi_xO_y$.

FIGS. 11 and 12 indicate that the amount of oxygen in $RuSi_xO_y$ film can actually be reduced by using $N_2O$ as a reaction gas presumably since small amounts of $N_2O$ increase growth rate without being incorporating.

It will be recognized by a person having skill in the art that, in addition to the embodiments described herein, the present invention may be carried out to include controlled deposition of one or more "monolayers" of $RuSi_xO_y$-containing barrier layer(s). This process, typically referred to as atomic layer deposition, atomic layer epitaxy, sequential layer deposition, or pulsed-gas CVD, involves use of a precursor based on self-limiting surface reactions. Generally, a substrate is exposed to a first species that deposits as a monolayer and the monolayer then being exposed to a second species to form a new layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films;" U.S. Pat. No. 4,413,022 to Suntola et al., entitled "Method for Performing Growth of Compound Thin Films;" Ylilammi, "Monolayer Thickness in Atomic Layer Deposition," Thin Solid Films 279 (1996) 124–130; and S. M. George et al., "Surface Chemistry for Atomic Layer Growth," J. Phys. Chem. 1996, 100, 13121–13131; the disclosures of each such document are hereby incorporated by reference.

The process has also been described as a CVD operation performed under controlled conditions which cause the deposition to be self-limiting to yield deposition of, at most, a monolayer. The deposition of a monolayer is significant in many areas because it facilitates theoretically conformal films, precise control of film thickness, and improved compound material layer uniformity. In practice, however, the deposited "monolayer" is rarely a complete and true monolayer, there always being something less than complete coverage of an underlying layer or other surface, due to the space consumed by the non-incorporating components of the metal organic precursor. Combinations of deposition processes discussed herein may be used to provide deposition materials (e.g., atomic layer deposition (ALD) and non-ALD types of CVD). Accordingly, exemplary embodiments of the invention include within their scope deposition of a monolayer under conditions designed to achieve such results, as well as conditions with a subsequent shift of conditions toward the CVD regime, such that, to the extent required, the deposition of the $RuSi_xO_y$-containing barrier layers is effected as 3–5 "monolayers" rather than a single monolayer.

More specifically, deposition of monolayers is accomplished in a CVD chamber, as previously described with reference to the CVD deposition method, but with the addition of pulsing valves to allow the switching between the precursor and purge gas and the $SiH_4$ ($Si_2H_6$) and purge gas. Bubblers, however, are not required since carrier gases may or may not be used, depending on the configuration of the vacuum system. For this example, a simple storage ampule with a single outlet and no inlet is used. As with the CVD method, $C_6H_8Ru(CO)_3$ is used as the ruthenium precursor. The deposition temperature of the wafer surface is 50–250 degrees C. and the reaction chamber is kept at a variable pressure range of about 0.5 torr to about 0.0001 torr. The reaction chamber is fully opened to the pumps of the vacuum system to create a vacuum in the CVD chamber and the ruthenium precursor gas is introduced at low pressure, preferably about 0.0001 torr. Introduction of the ruthenium precursor gas under these conditions will result in the deposition of, at most, a monolayer of ruthenium over the surface of the wafer. A purge cycle is then initiated by introducing a nonreactive gas, such as He or Ar, at a volumetric flow rate of about 50 sccm into the reaction chamber at 0.5 torr. It is understood that any suitable nonreactive gas may be used and that the nonreactive gas may be introduced at a rate of between about 0.1 sccm to about 500 sccm to optimize system conditions. Silane or disilane is introduced into the reaction chamber at a rate of about 5 sccm, which results in the deposition of a silicon monolayer over the previously deposited ruthenium monolayer. This is followed by a purge cycle of nonreactive gas, as previously described. It is understood that oxygen can be added as a separate oxygen/purge cycle as needed for every individual cycle in order to give the required oxygen content. In general, however, sufficient oxygen is available from background $O_2$ and $H_2O$ in the chamber to oxidize the underlying $RuSi_x$ layer formed in the preceding steps. The monolayer of adsorbed precursor from the initial precursor deposition step will react directly when exposed to the reaction gas in the third step of the foregoing dose precursor/purge/dose reaction gas/purge sequence, which results in controlled deposition of one or more $RuSi_xO_y$-containing barrier monolayers.

Although this invention has been described with reference to illustrative embodiments, it is not meant to be construed in a limiting sense. As described previously, one skilled in the art will recognize that various other illustrative applications may use the $RuSi_xO_y$ diffusion barrier layer as described herein to take advantage of the beneficial barrier characteristics thereof. Various modifications of the illustrative embodiments, as well as additional embodiments to the invention, will be apparent to persons skilled in the art upon reference to this description. It is therefore contemplated that any such modifications or embodiments may fall within the scope of the present invention as defined by the accompanying claims.

What is claimed is:

1. A method for forming a semiconductor device structure comprising:
   providing a semiconductor substrate assembly having a surface;
   forming a layer of ruthenium relative to a silicon-containing region; and
   performing an anneal in an oxidizing atmosphere to form $RuSi_xO_y$ from the layer of ruthenium and the silicon-containing region.

2. The method of claim 1, wherein forming the layer of ruthenium includes depositing the layer of ruthenium by chemical vapor deposition.

3. The method of claim 1, wherein forming the layer of ruthenium includes depositing the layer of ruthenium by atomic layer deposition.

4. The method of claim 3, wherein forming the layer of ruthenium includes depositing three to five monolayers of $RuSi_xO_y$.

5. The method of claim 1, wherein performing the anneal in an oxidizing atmosphere includes performing an anneal in an atmosphere including an oxidizing gas.

6. The method of claim 1, further including forming at least one additional conductive material over a diffusion barrier layer and selecting the at least one additional conductive material from a group of a metal and a conductive metal oxide.

7. The method of claim 1, wherein performing the anneal in an oxidizing atmosphere to form the $RuSi_xO_y$ includes performing an anneal at a temperature in a range of about 400° C. to about 1000° C.

8. The method of claim 1, wherein performing the anneal in an oxidizing atmosphere to form $RuSi_xO_y$ from the layer of ruthenium and the silicon-containing region comprises performing the anneal in an atmosphere comprising air, oxygen, and oxygen-containing compounds.

9. The method of claim 1, wherein the silicon-containing region includes at least a portion of the semiconductor substrate assembly.

10. The method of claim 1, wherein the $RuSi_xO_y$ is deposited in an oxidizing atmosphere.

11. The method of claim 1, wherein the $RuSi_xO_y$ is deposited in an atmosphere including an oxidizing gas.

12. A method for forming a semiconductor device structure having a $RuSi_xO_y$ barrier layer, the method comprising:
   (a) placing a semiconductor substrate assembly in a reaction chamber, the semiconductor substrate assembly having a surface;
   (b) introducing a ruthenium precursor into the reaction chamber to form a single layer of ruthenium on at least a portion of the semiconductor substrate assembly surface;
   (c) introducing a nonreactive gas into the reaction chamber to substantially cover the single layer of ruthenium and purge the ruthenium precursor from the reaction chamber;
   (d) introducing a silicon precursor into the reaction chamber to form a single layer of $RuSi_xO_y$ on at least a portion of the semiconductor substrate assembly surface; and
   (e) introducing a nonreactive gas into the reaction chamber to substantially cover the single layer of $RuSi_xO_y$ and purge the silicon precursor from the reaction chamber.

13. The method of claim 12, further comprising introducing an oxygen-containing substance into the reaction chamber to form a single barrier layer of $RuSi_xO_y$ on the at least a portion of the semiconductor substrate assembly surface.

14. The method of claim 12, wherein the introducing the silicon precursor into the reaction chamber comprises introducing the silicon precursor in an oxidizing atmosphere within the reaction chamber.

15. The method of claim 14, wherein the introducing the silicon precursor in an oxidizing atmosphere comprises introducing the silicon precursor in an atmosphere comprising air, oxygen, or an oxygen-containing compound.

16. The method of claim 12, wherein the ruthenium precursor comprises $C_6H_8Ru(CO)_3$.

17. The method of claim 12, wherein the introducing the nonreactive gas comprises introducing a nonreactive gas selected from a group consisting of nitrogen, argon, neon, and xenon.

18. The method of claim 12, wherein the introducing the silicon precursor comprises introducing silane or disilane into the reaction chamber.

19. The method of claim 12, wherein steps (a) through (e) are repeated to form 3 to 5 $RuSi_xO_y$ barrier monolayers.

* * * * *

UNITED STATES PATENT AND TRADEMARK OFFICE
CERTIFICATE OF CORRECTION

PATENT NO. : 6,903,005 B1  Page 1 of 1
APPLICATION NO. : 09/651620
DATED : June 7, 2005
INVENTOR(S) : Marsh It is certified that error appears in the above-identified patent and that said Letters Patent is hereby corrected as shown below:

On the title page, in field (54), in "Title", in column 1, line 2, delete "$RUSI_XO_Y$" and insert -- $RuSi_xO_y$ --, therefor.

On the title page, in field (54), in "Title", in column 1, line 3, delete "HIGH-K" and insert -- HIGH-k --, therefor.

In column 1, line 2, delete "$RUSI_XO_Y$" and insert -- $RuSi_xO_y$ --, therefor.

In column 1, line 3, delete "HIGH-K" and insert -- HIGH-k --, therefor.

Signed and Sealed this

Twenty-ninth Day of April, 2008

JON W. DUDAS
*Director of the United States Patent and Trademark Office*